(12) United States Patent
Fukumizu et al.

(10) Patent No.: US 8,471,325 B2
(45) Date of Patent: Jun. 25, 2013

(54) NONVOLATILE MEMORY DEVICE AND METHOD FOR MANUFACTURING THE SAME

(75) Inventors: Hiroyuki Fukumizu, Kanagawa-ken (JP); Noriko Bota, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 12/885,599

(22) Filed: Sep. 20, 2010

(65) Prior Publication Data

US 2011/0031468 A1    Feb. 10, 2011

Related U.S. Application Data

(63) Continuation of application No. PCT/JP2008/065589, filed on Aug. 29, 2008.

(30) Foreign Application Priority Data

Mar. 28, 2008   (JP) ................................. 2008-085563

(51) Int. Cl.
  *H01L 29/788* (2006.01)
(52) U.S. Cl.
  USPC ........... 257/316; 257/318; 257/324; 257/298; 257/317; 257/320; 365/184; 365/145; 365/185.06; 438/129; 438/257; 438/264; 438/593
(58) Field of Classification Search
  USPC ................ 257/316, 318, 324, 298, 317, 320, 257/321; 365/184, 145, 185.06; 438/129, 438/257, 264, 593
  See application file for complete search history.

(56) References Cited

U.S. PATENT DOCUMENTS

| | | | |
|---|---|---|---|
| 2006/0215445 A1* | 9/2006 | Baek et al. | 365/158 |
| 2007/0132049 A1 | 6/2007 | Stipe | |
| 2010/0044666 A1* | 2/2010 | Baek et al. | 257/2 |

FOREIGN PATENT DOCUMENTS

| | | |
|---|---|---|
| JP | 2005-347468 | 12/2005 |
| JP | 2006-32728 | 2/2006 |
| JP | 2006-203178 | 8/2006 |
| JP | 2007-149170 | 6/2007 |
| JP | 2007-165873 | 6/2007 |
| JP | 2007-184419 | 7/2007 |
| JP | 2008-60091 | 3/2008 |
| WO | WO 2006-075574 | 7/2006 |

* cited by examiner

*Primary Examiner* — Telly Green
(74) *Attorney, Agent, or Firm* — Oblon, Spivak, McClelland, Maier & Neustadt, L.L.P.

(57) ABSTRACT

According to one embodiment, a nonvolatile memory device includes a substrate, a first electrode, a second electrode, a third electrode, a first memory portion and a second memory portion. The first electrode extends in a first direction and is provided on the substrate. The second electrode extends in a second direction crossing the first direction and is provided on the first electrode. The third electrode extends in a third direction crossing the second direction and is provided on the second electrode. The first memory portion is provided between the first and the second electrodes and has a first oxygen composition ratio and a first layer thickness. The second memory portion is provided between the second and the third electrodes and has at least one of a second oxygen composition ratio different from the first oxygen composition ratio and a second layer thickness different from the first layer thickness.

18 Claims, 10 Drawing Sheets

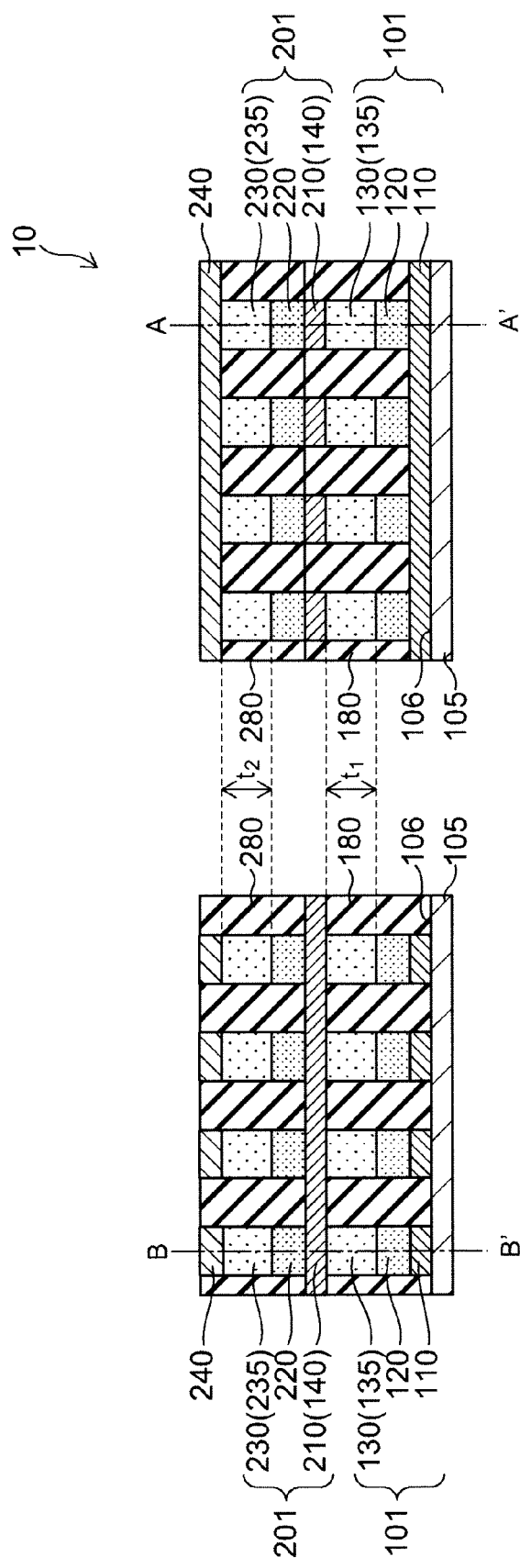

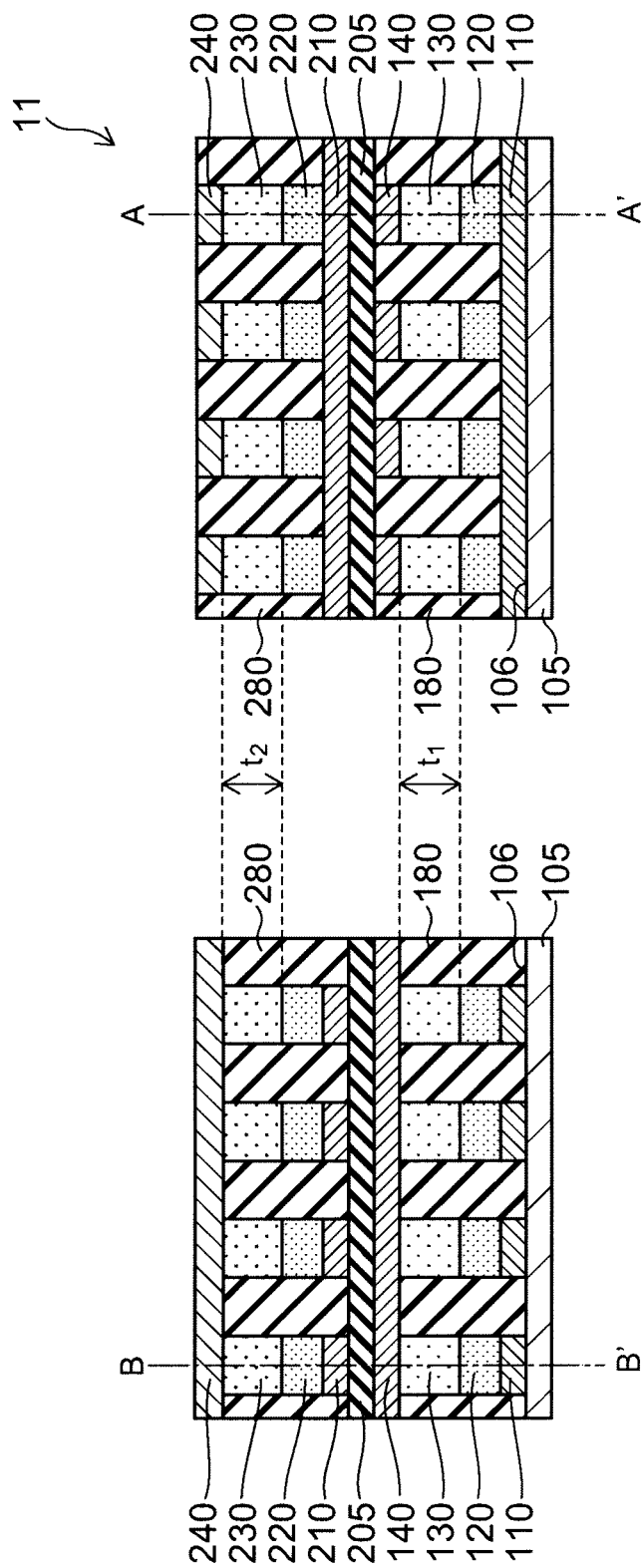

US 8,471,325 B2

NONVOLATILE MEMORY DEVICE AND METHOD FOR MANUFACTURING THE SAME

CROSS-REFERENCE TO RELATED APPLICATIONS

This is a continuation application of International Application PCT/JP2008/065589, filed on Aug. 29, 2008. This application also claims priority to Japanese Application No. 2008-85563, filed on Mar. 28, 2008. The entire contents of each are incorporated herein by reference.

FIELD

Embodiments described herein relate generally to a nonvolatile memory device and a method for manufacturing the same.

BACKGROUND

Flash memories widely used as nonvolatile memory devices are regarded as being limited in the improvement of integration density. As a nonvolatile memory device enabling a higher integration density than flash memories, a cross-point nonvolatile memory device has been drawing attention. The cross-point nonvolatile memory device is configured so that, for instance, a memory portion having variable electrical resistance is sandwiched between two electrodes (JP-A 2007-184419 (Kokai)). Furthermore, there is also a nonvolatile memory device having a three-dimensional structure in which the aforementioned cross-point nonvolatile memory devices are stacked.

In this case, the first-layer memory portion and the second-layer and higher memory portion stacked thereon are subjected to different histories (e.g., thermal histories) associated with e.g. treatment during the manufacturing process. Hence, these memory portions become different in electrical characteristics. This causes the problem of being difficult to realize stable operation in memory retention and reading.

BRIEF DESCRIPTION OF THE DRAWINGS

FIGS. 2A and 2B are schematic cross-sectional views illustrating the configuration of the nonvolatile memory device according to the first embodiment;

FIGS. 5A and 5B are schematic views illustrating the configuration of an alternative nonvolatile memory device according to the first embodiment;

DETAILED DESCRIPTION

Figure 1A:
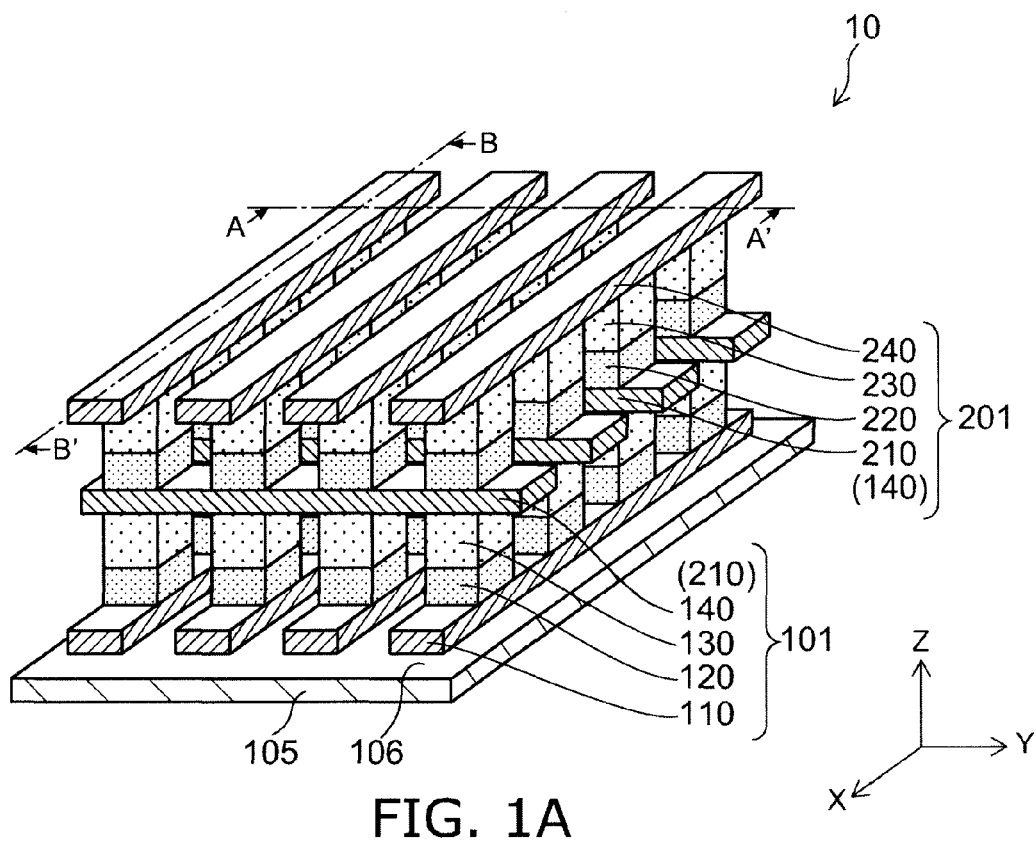
FIGS. 1A and 1B are schematic views illustrating the configuration of a nonvolatile memory device according to a first embodiment.

In general, according to one embodiment, a nonvolatile memory device includes a substrate, a first electrode, a second electrode, a third electrode, a first memory portion, and a second memory portion. The first electrode extends in a first direction and is provided on the substrate. The second electrode extends in a second direction crossing the first direction and is provided on the first electrode. The third electrode extends in a third direction crossing the second direction and is provided on the second electrode. The first memory portion is provided between the first electrode and the second electrode and has a first oxygen composition ratio and a first layer thickness. The second memory portion is provided between the second electrode and the third electrode and has at least one of a second oxygen composition ratio different from the first oxygen composition ratio and a second layer thickness different from the first layer thickness.

In general, according to another embodiment, a nonvolatile memory device includes a substrate, a first electrode, a second electrode, a third electrode, a fourth electrode, a first memory portion and a second memory portion. The first electrode extends in a first direction and is provided on the substrate. The second electrode extends in a second direction crossing the first direction and is provided on the first electrode. The third electrode extends in a third direction and is provided on the second electrode. The fourth electrode extends in a fourth direction crossing the third direction and is provided on the third electrode. The first memory portion is provided between the first electrode and the second electrode and has a first oxygen composition ratio and a first layer thickness. The second memory portion is provided between the third electrode and the fourth electrode and has at least one of a second oxygen composition ratio different from the first oxygen composition ratio and a second layer thickness different from the first layer thickness.

In general, according to another embodiment, a method for manufacturing a nonvolatile memory device is disclosed. The method includes; forming a first electrode extending in a first direction on a substrate; forming a first memory portion having a first oxygen composition ratio and a first layer thickness on the first electrode; forming a second electrode provided on the first memory portion and extending in a second direction crossing the first direction; forming a second memory portion having at least one of a second oxygen composition ratio different from the first oxygen composition ratio and a second layer thickness different from the first layer thickness on the second electrode; and forming a third electrode provided on the second memory portion and extending in a direction crossing the second direction.

In general, according to another embodiment, a method for manufacturing a nonvolatile memory device is disclosed. The method includes: forming a first electrode extending in a first direction on a substrate; forming a first memory portion having a first oxygen composition ratio and a first layer thickness on the first electrode; forming a second electrode provided on the first memory portion and extending in a second direction crossing the first direction; forming a third electrode provided on the second electrode and extending in a direction crossing the second electrode; forming a second memory portion having at least one of a second oxygen composition ratio different from the first oxygen composition ratio and a second layer thickness different from the first layer thickness on the third electrode; and forming a fourth electrode provided on the second memory portion and extending in a direction crossing the third electrode.

Embodiments will now be described in detail with reference to the drawings.

First Embodiment

Figure 1B:
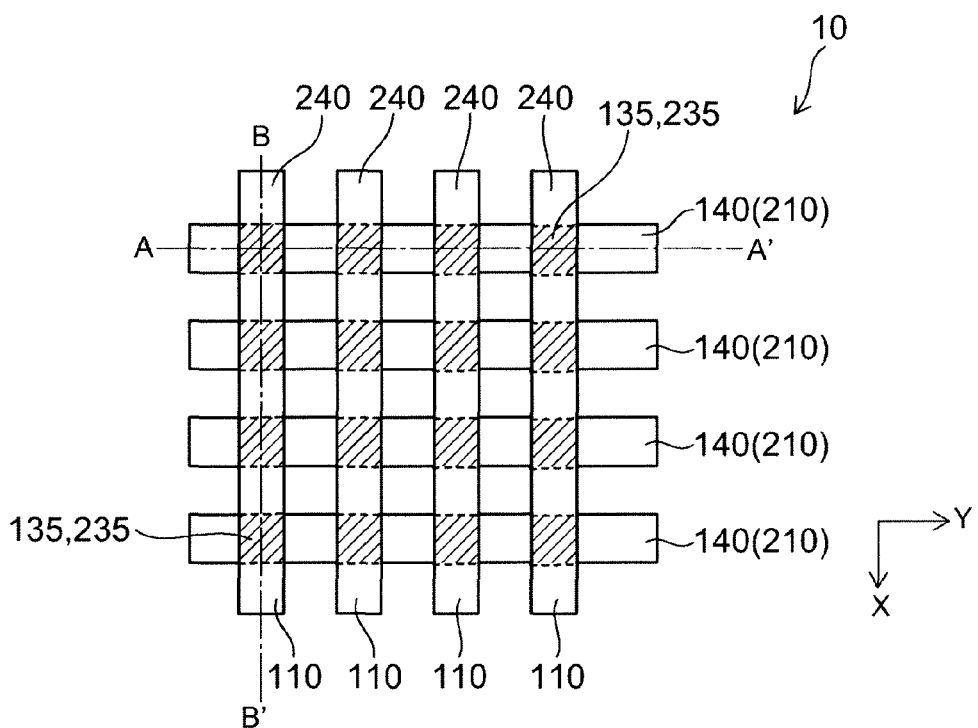

FIGS. 1A and 1B are schematic views illustrating the configuration of a nonvolatile memory device according to a first embodiment.

FIGS. 2A and 2B are schematic cross-sectional views illustrating the configuration of the nonvolatile memory device according to the first embodiment.

In this specification and in FIG. 2A and the subsequent figures, components similar to those described previously with reference to earlier figures are labeled with like reference numerals, and the detailed description thereof is omitted as appropriate.

FIGS. 1A and 1B are a schematic perspective view and a schematic transparent plan view, respectively, illustrating the configuration of the nonvolatile memory device according to the first embodiment. FIG. 2A is a cross-sectional view taken along line A-A' of FIGS. 1A and 1B, and FIG. 2B is a cross-sectional view taken along line B-B' of FIGS. 1A and 1B.

As shown in FIGS. 1A to 2B, the nonvolatile memory device 10 according to the first embodiment includes a first lower electrode 110 provided on the major surface 106 of a substrate 105, a first upper electrode 140 opposed to the first lower electrode 110, a first memory portion 130 provided between the first lower electrode 110 and the first upper electrode 140. Furthermore, the nonvolatile memory device 10 further includes a second lower electrode 210 provided on the first memory portion 130, a second upper electrode 240 opposed to the second lower electrode 210, and a second memory portion 230 provided between the second lower electrode 210 and the second upper electrode 240.

The first memory portion 130 includes a first metal oxide having a first oxygen composition ratio and has a first layer thickness $t_1$. The second memory portion 230 includes a second metal oxide having a second oxygen composition ratio and has a second layer thickness $t_2$.

The nonvolatile memory device 10 illustrated in FIGS. 1A to 2B has a structure in which the first upper electrode 140 and the second lower electrode 210 are shared with each other. That is, the first upper electrode 140 and the second lower electrode 210 are identical. That is, the nonvolatile memory device 10 includes a substrate 105, a plurality of first electrodes (first lower electrodes) 110 extending in a first direction and provided on the substrate 105, a plurality of second electrodes (first upper electrodes) 140 extending in a second direction crossing the first direction and provided on the first electrodes 110, a plurality of third electrodes (second upper electrodes) 240 extending in a third direction crossing the second direction and provided on the second electrodes 140, a first memory portion 130 provided between the first electrode 110 and the second electrode 140 and having a first oxygen composition ratio and a first layer thickness $t_1$, and a second memory portion 230 provided between the second electrode 140 and the third electrode 240 and having at least one of a second oxygen composition ratio different from the first oxygen composition ratio and a second layer thickness $t_2$ different from the first layer thickness. However, as described later, the embodiment is not limited thereto, but the first upper electrode 140 and the second lower electrode 210 may be separately provided.

Here, the first lower electrode 110, the first memory portion 130, and the first upper electrode 140 are referred to as a first stacked stage 101. The second lower electrode 210, the second memory portion 230, and the second upper electrode 240 are referred to as a second stacked stage 201. That is, the nonvolatile memory device 10 of this embodiment is a nonvolatile memory device having a three-dimensional structure in which the first stacked stage 101 and the second stacked stage 201 are stacked.

The extending direction of the first lower electrode 110 is defined as X-axis direction. The extending direction of the first upper electrode 140 is defined as Y-axis direction. The X-axis direction and the Y-axis direction are substantially orthogonal to each other. The direction orthogonal to the X-axis and the Y-axis is defined as Z-axis direction. Then, the extending direction of the second lower electrode 210 (first upper electrode 140) is the Y-axis direction, and the extending direction of the second upper electrode 240 is the X-axis direction. That is, in the first stacked stage 101, the first lower electrode 110 and the first upper electrode 140 three-dimensionally cross each other (here, these are substantially orthogonal). In the second stacked stage 201, the second lower electrode 210 and the second upper electrode 240 three-dimensionally cross each other (here, these are substantially orthogonal).

Here, the nonvolatile memory device 10 shown in FIGS. 1A to 2B has a two-stage structure including the first stacked stage 101 and the second stacked stage 201. However, the embodiment is not limited thereto. The number of stacked stages may be three or more.

In the example shown in FIGS. 1A to 2B, the first lower electrode 110, the first upper electrode 140 (second lower electrode 210), and the second upper electrode 240 are orthogonal to each other. However, the embodiment is not limited thereto. That is, these electrodes do not necessarily need to be orthogonal to each other, but only need to have a relation in which adjacent electrodes three-dimensionally cross (are non-parallel to) each other.

The substrate 105 can be e.g. a silicon substrate. On this silicon substrate, a driver circuit for driving the nonvolatile memory device can also be provided.

The first memory portion 130 and the second memory portion 230 can include various transition metal oxides having electrical resistance changing with the applied voltage, such as nickel oxide ($NiO_x$), titanium oxide ($TiO_x$), manganese oxide ($MnO_x$), $ZnFe_2O_4$, $ZnMn_2O_4$, and $Pr_xCa_{1-x}MnO_3$. Alternatively, the memory portions can include a phase transition material.

The first lower electrode 110, the first upper electrode 140 (second lower electrode 210), and the second upper electrode 240 can include e.g. tungsten, tungsten silicide, aluminum, or copper.

Here, the lower electrode 110 is referred to as bit line (BL), and the upper electrode 140 is referred to as word line (WL). However, alternatively, the lower electrode 110 may be referred to as word line (WL), and the upper electrode 140 may be referred to as bit line (BL).

In the nonvolatile memory device 10, depending on the combination of the potential applied to the first lower electrode 110 and the potential applied to the first upper electrode 140, the voltage applied to the first memory portion 130 is varied. Due to the characteristics of the first memory portion 130 in response thereto, information can be stored. Here, to impart directionality to the polarity of the voltage applied to the first memory portion 130, a first switching element portion 120 having e.g. rectifying characteristics can be provided. The first switching element portion 120 can include e.g. a PIN diode, a MIM (metal-insulator-metal) element, or a Schottky diode element.

In the example shown in FIGS. 1A to 2B, the first switching element portion 120 is provided between the first lower electrode 110 and the first memory portion 130. However, the first switching element portion 120 may be provided between the first upper electrode 140 and the first memory portion 130. Alternatively, the first switching element portion 120 may be provided in a region other than the region where the first lower electrode 110 and the first upper electrode 140 are opposed to each other.

Similarly, to impart directionality to the polarity of the voltage applied to the second memory portion 230, a second switching element portion 220 can be provided. In the example shown in FIGS. 1A to 2B, the second switching element portion 220 is provided between the second lower electrode 210 and the second memory portion 230. However, the second switching element portion 220 may be provided between the second upper electrode 240 and the second memory portion 230. Alternatively, the second switching element portion 220 may be provided in a region other than the region where the second lower electrode 210 and the second upper electrode 240 are opposed to each other.

Furthermore, in the nonvolatile memory device 10, a barrier metal layer, not shown, can be provided between the first lower electrode 110 and the first switching element portion 120, between the first switching element portion 120 and the first memory portion 130, and between the first memory portion 130 and the first upper electrode 140.

Similarly, a barrier metal layer, not shown, can be provided between the second lower electrode 210 and the second switching element portion 220, between the second switching element portion 220 and the second memory portion 230, and between the second memory portion 230 and the second upper electrode 240.

These barrier metal layers can include titanium nitride (TiN) or tantalum nitride (TaN).

In the first stacked stage 101, the first lower electrode 110 and the first upper electrode 140 opposed to each other form a first memory cell portion 135. In the portion between the first memory cell portions 135, a first device isolation insulating region 180 can be provided. Furthermore, in the second stacked stage 201, the second lower electrode 210 and the second upper electrode 240 opposed to each other form a second memory cell portion 235. In the portion between the second memory cell portions 235, a second device isolation insulating region 280 can be provided. These first device isolation insulating region 180 and second device isolation insulating region 280 can include e.g. a silicon oxide film, silicon nitride film, or aluminum nitride film.

In the nonvolatile memory device 10, at least one of the second oxygen composition ratio and the second layer thickness $t_2$ is different from the first oxygen composition ratio and the first layer thickness $t_1$. Specifically, in the nonvolatile memory device 10, the second layer thickness $t_2$ is substantially equal to the first layer thickness $t_1$, but the second oxygen composition ratio is different from the first oxygen composition ratio.

Thus, a nonvolatile memory device including stacked memory portions and a method for manufacturing the same are realized in which stable operation is achieved by reducing the characteristic difference due to the influence of the history associated with e.g. treatment during the manufacturing process (hereinafter exemplified by thermal history) between the first memory portion 130 and the second memory portion 230.

Figure 3A:
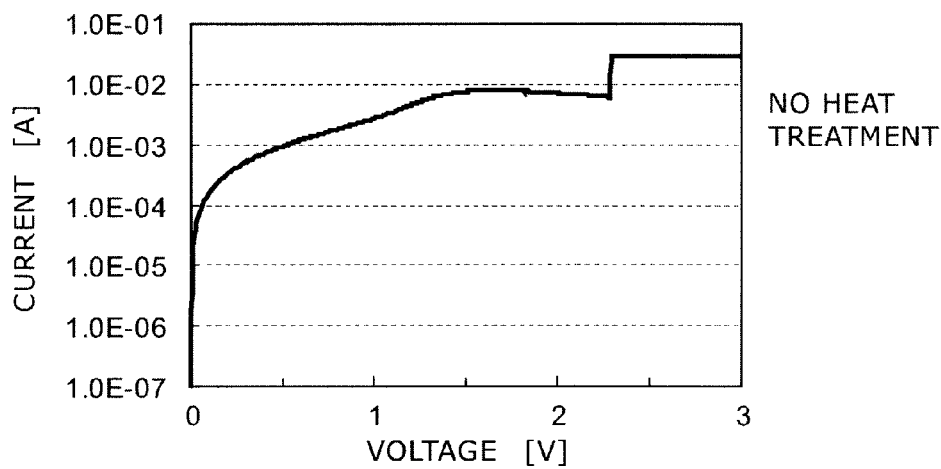
FIGS. 3A to 3C are graphs illustrating the characteristics of material used for a memory portion of the nonvolatile memory device according to the first embodiment.
Figure 3B:
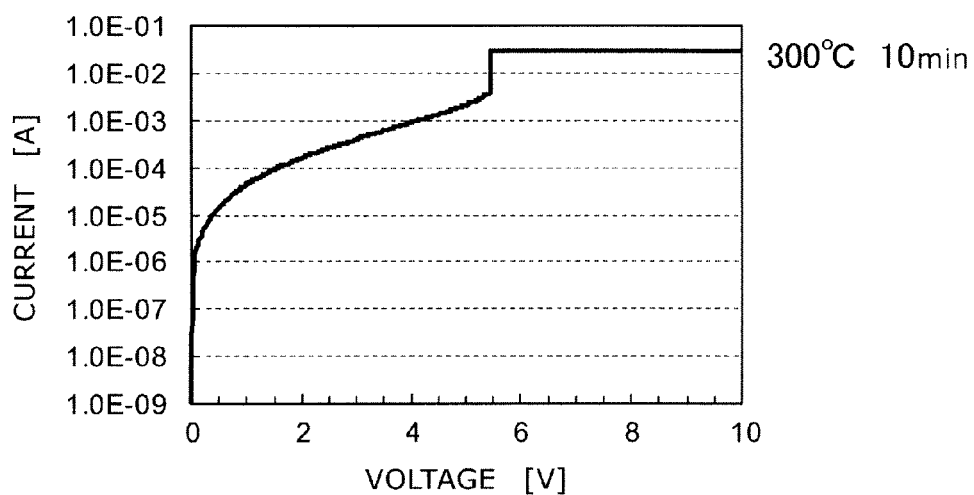
Figure 3C:
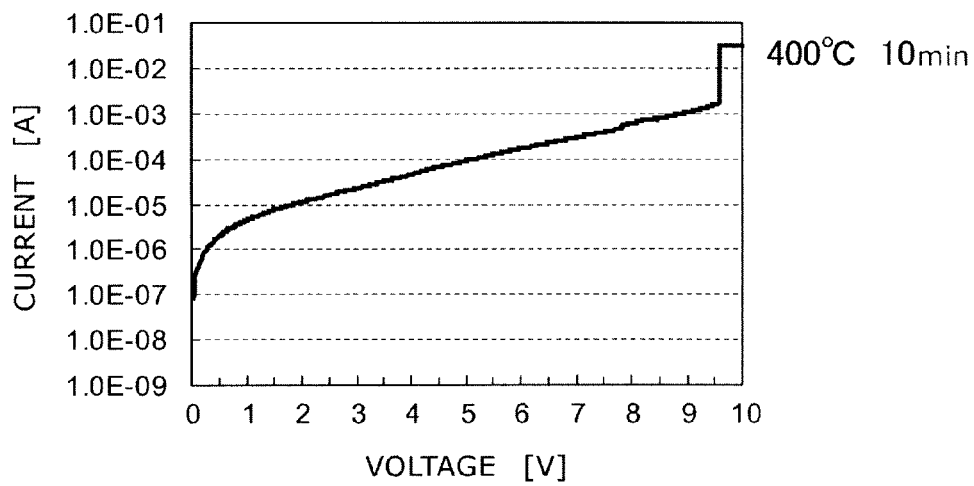

FIGS. 3A to 3C are graphs illustrating the characteristics of the material used for the memory portion of the nonvolatile memory device according to the first embodiment.

More specifically, FIGS. 3A to 3C illustrate the current-voltage characteristics under different annealing conditions for $NiO_x$ used for the memory portion of the nonvolatile memory device. The horizontal axis represents the applied voltage applied to the $NiO_x$ layer, and the vertical axis represents the current flowing in the $NiO_x$ layer. FIGS. 3A to 3C illustrate the results for no annealing treatment, the annealing treatment at 300° C. for 10 minutes, and the annealing treatment at 400° C. for 10 minutes.

As shown in FIG. 3A, in the case of no annealing treatment, the forming voltage was 2.3 V. In contrast, as shown in FIG. 3B, in the case of the annealing temperature being 300° C., the forming voltage was 5.4 V. Furthermore, as shown in FIG. 3C, in the case of the annealing temperature being 400° C., the forming voltage was 9.6 V. Thus, the forming voltage increased with the increase of the annealing temperature.

The off-current $I_{off}$ in the high resistance state after forming was read at 1 V. Then, the off-current $I_{off}$ was $5.3 \times 10^{-4}$ A, $2.3 \times 10^{-5}$ A, and $3.8 \times 10^{-6}$ A for no annealing treatment, the annealing treatment at 300° C., and the annealing treatment at 400° C., respectively.

That is, in the case of using $NiO_x$ for the resistance change film (memory portion), the off-current of $NiO_x$ tends to decrease as the annealing temperature is made higher. Similarly, the off-current decreases as the annealing time is made longer. Furthermore, the forming voltage for causing soft breakdown also varies with the annealing condition.

Here, in the conventional nonvolatile memory device of the stacked type, the films used for the first memory portion 130 and the second memory portion 230 are formed with the same composition and the same layer thickness. Thus, the first lower electrode 110, first switching element portion 120, first memory portion 130, first upper electrode 140, first device isolation insulating region 180, and various barrier layers of the first stacked stage 101 are heated by heating and annealing during film formation for forming the layers of the second stacked stage 201. This thermal process is applied also to the first memory portion 130, which has already been formed. Hence, the first memory portion 130 and the second memory portion 230 are subjected to different thermal histories. This causes the difference between the electrical characteristics of the first memory portion 130 and the electrical characteristics of the second memory portion 230.

Thus, the metal oxide, such as $NiO_x$, used for the memory portion of the nonvolatile memory device 10 undergoes variation in electrical characteristics due to the annealing condition, i.e., thermal history. This causes variation in the current value for determining the on/off state at the read time, and also causes variation in the off-current and the forming voltage.

Here, in the nonvolatile memory device 10 of this embodiment, in forming the $NiO_x$ films, the oxygen composition ratio in $NiO_x$ is varied between in the first memory portion 130 and in the second memory portion 230. This can compensate for such difference in the electrical characteristics of the memory portions due to thermal history. Thus, the reset current and the forming voltage can be made substantially equal in the first memory portion 130 and the second memory portion 230.

For instance, by varying the film formation condition for forming the films serving as the first and second memory portion 130, 230, the first and second oxygen composition ratio can be varied. For instance, in the case of using $NiO_x$ for the memory portion, film formation is performed by DC sputtering a Ni target in Ar gas added with $O_2$. Here, for instance, by varying the flow rate of Ar gas and the flow rate of $O_2$ gas, the first and second oxygen composition ratio can be varied.

For instance, the film formation condition is adjusted so that the oxygen composition ratio in $NiO_x$ is lower in the second memory portion 230 than in the first memory portion 130. This can reduce the difference in characteristics such as the off-current and the forming voltage in the layers of the first and second memory portion 130, 230.

Figure 4:
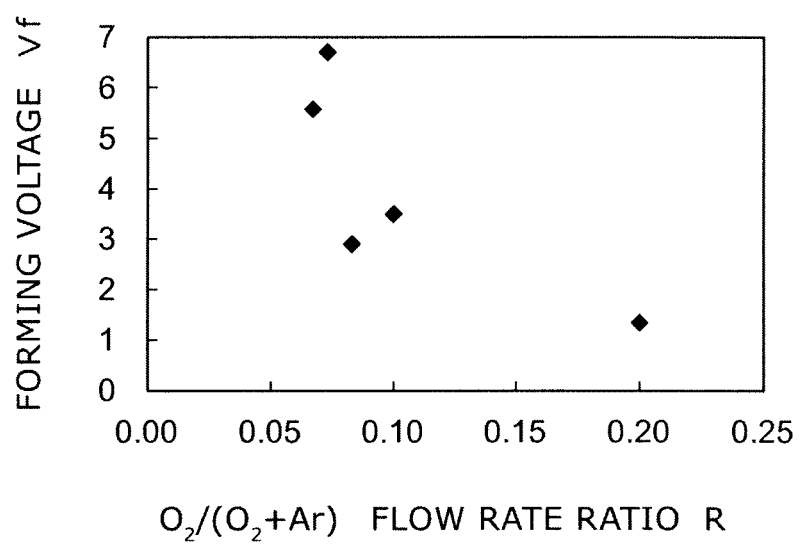
FIG. 4 is a graph illustrating the characteristics of the nonvolatile memory device according to the first embodiment.

FIG. 4 is a graph illustrating the characteristics of the nonvolatile memory device according to the first embodiment.

More specifically, FIG. 4 illustrates the forming voltage in the case where the $NiO_x$ film, as the material used for the memory portion, is formed with the flow rate of Ar and $O_2$ varied. The horizontal axis represents the flow rate ratio R of $O_2$ gas to $(O_2+Ar)$ gas, and the vertical axis represents the forming voltage $V_f$.

As shown in FIG. 4, with the increase of the flow rate ratio R of $O_2$ gas, the forming voltage $V_f$ decreases. Thus, by varying the flow rate ratio R of $O_2$ gas, i.e., the gas composition, the oxygen composition ratio of the memory portion can be varied to control the forming voltage $V_f$. By making use of this characteristic, the film formation condition for the first memory portion 130 and the second memory portion 230 is varied so as to compensate for the characteristics difference due to thermal history during the process for manufacturing the first memory portion 130 and the second memory portion 230. Thus, the oxygen composition ratio can be varied so that the first memory portion 130 and the second memory portion 230 have substantially the same characteristics.

Thus, the nonvolatile memory device 10 provides a nonvolatile memory device including stacked memory portions and a method for manufacturing the same in which stable operation is achieved by reducing the characteristic difference due to the influence of thermal history during the manufacturing process between the first memory portion 130 and the second memory portion 230.

Here, the same target can be used in the process of forming the first memory portion 130 and the process of forming the second memory portion 230. That is, even if the same target is used in the process of forming the first memory portion 130 and the process of forming the second memory portion 230, the oxygen composition ratio can be varied between in the first memory portion 130 and in the second memory portion 230 by varying the flow rate ratio, i.e., composition ratio, of the gases used. Thus, without exchanging the target, a nonvolatile memory device including stacked memory portions can be realized in which stable operation is achieved by reducing the characteristic difference due to the influence of the history associated with e.g. treatment during the manufacturing process.

FIGS. 5A and 5B are schematic views illustrating the configuration of an alternative nonvolatile memory device according to the first embodiment.

As shown in FIGS. 5A and 5B, in the alternative nonvolatile memory device 11 according to the first embodiment, the first upper electrode 140 and the second lower electrode 210 are separately provided. More specifically, an insulating layer 205 is provided on the first upper electrode 140, and a second lower electrode 210 is provided on the insulating layer 205.

The remaining configuration can be made similar to that of the nonvolatile memory device 10. That is, the nonvolatile memory device 11 includes a substrate 105, a plurality of first electrodes (first lower electrodes) 110 extending in a first direction and provided on the substrate 105, a plurality of second electrodes (first upper electrodes) 140 extending in a second direction crossing the first direction and provided on the first electrodes 110, a plurality of third electrodes (second lower electrodes) 210 extending in a third direction and provided on the second electrodes 140, a plurality of fourth electrodes (second upper electrodes) 240 extending in a fourth direction crossing the third direction and provided on the third electrodes 210, a first memory portion 130 provided between the first electrode 110 and the second electrode 140 and having a first oxygen composition ratio and a first layer thickness $t_1$, and a second memory portion 230 provided between the third electrode 210 and the fourth electrode 240 and having at least one of a second oxygen composition ratio different from the first oxygen composition ratio and a second layer thickness $t_2$ different from the first layer thickness $t_1$.

Thus, also in the nonvolatile memory device 11 with the first upper electrode 140 and the second lower electrode 210 separately provided therein, the second oxygen composition ratio of the second memory portion 230 can be made different from the first oxygen composition ratio of the first memory portion 130. Accordingly, a nonvolatile memory device including stacked memory portions is provided in which stable operation is achieved by reducing the characteristic difference due to the influence of thermal history during the manufacturing process between the first memory portion 130 and the second memory portion 230.

In the nonvolatile memory device 11 illustrated in FIGS. 5A and 5B, the second lower electrode 210 extends in the X-axis direction like the first lower electrode 110. However, the second lower electrode 210 may extend in the Y-axis direction. In this case, the extending direction of the second upper electrode 240 is set to the X-axis direction.

Furthermore, the first lower electrode 110 and the first upper electrode 140, or the second lower electrode 210 and the second upper electrode 240, do not need to be orthogonal to each other, but only need to have a relation in which they three-dimensionally cross (are non-parallel to) each other. Furthermore, for instance, the first upper electrode 140 and the second lower electrode 210 also do not need to be orthogonal or parallel to each other, but may have a relation in which they three-dimensionally cross (are non-parallel to) each other.

In the foregoing description, as an example of varying the oxygen composition ratio between in the first memory portion 130 and in the second memory portion 230, the composition of the gas used for film formation is varied (specifically, the flow rate ratio R of $O_2$ gas is varied). However, the embodiment is not limited thereto.

For instance, different targets may be used for the first memory portion 130 and the second memory portion 230. Furthermore, it is also possible to vary the composition of the atmosphere gas for e.g. the annealing treatment after the respective processes for forming the film serving as the first memory portion 130 and the film serving as the second memory portion 230. That is, the oxygen composition ratio can be varied between in the first memory portion 130 and in the second memory portion 230 by performing e.g. treatment in atmospheres with different oxygen concentrations after the respective processes for forming the film serving as the first memory portion 130 and the film serving as the second memory portion 230.

Furthermore, in the case where the aforementioned first switching element portion 120 and second switching element portion 220 are provided, by varying the composition of the films used for these switching element portions, the oxygen composition ratio of the first memory portion 130 and the second memory portion 230 adjacent to these switching element portions can be varied. For instance, the target or the oxygen content ratio of the gas used for forming the film serving as the first switching element portion 120 can be made different from the target or the oxygen content ratio of the gas used for forming the film serving as the second switching element portion 220. Thus, the oxygen content ratio in the first switching element portion 120 and the oxygen content ratio in the second switching element portion 220 can be made different. Accordingly, the amount of oxygen diffusing from the first switching element portion 120 into the first memory portion 130 adjacent thereto and the amount of oxygen diffusing from the second switching element portion 220 into the second memory portion 230 adjacent thereto can be made different. Consequently, the oxygen composition ratio can be made different in the first memory portion 130 and in the second memory portion 230.

These approaches can realize a nonvolatile memory device including stacked memory portions in which stable operation is achieved by reducing the characteristic difference due to the influence of the history associated with e.g. treatment during the manufacturing process.

Second Embodiment

Figures 6A, 6B:
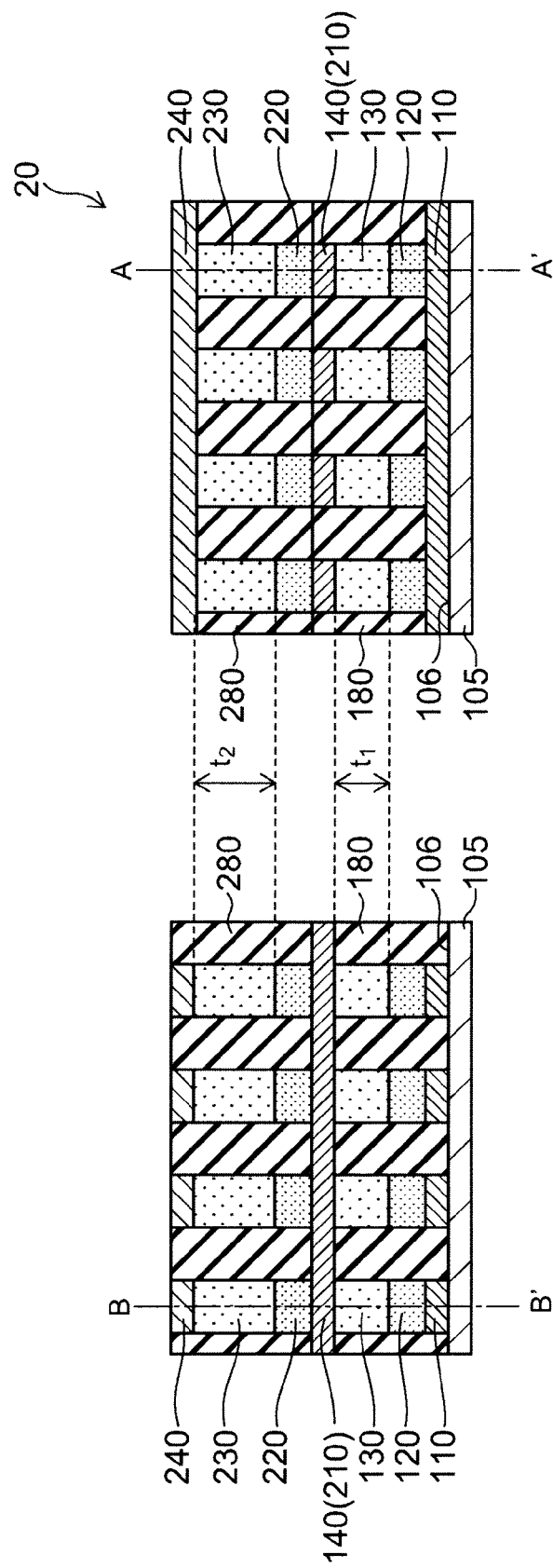
FIGS. 6A and 6B are schematic views illustrating the configuration of a nonvolatile memory device according to a second embodiment.

FIGS. 6A and 6B are schematic views illustrating the configuration of a nonvolatile memory device according to a second embodiment.

As shown in FIGS. 6A and 6B, in the nonvolatile memory device 20 according to the second embodiment, the layer thickness $t_2$ of the second memory portion 230 is different from the layer thickness $t_1$ of the first memory portion 130. Specifically, the layer thickness $t_2$ of the second memory portion 230 is set thicker than the layer thickness $t_1$ of the first memory portion 130.

More specifically, as described above, the first memory portion 130 is subjected to thermal load due to thermal history during the subsequent process for manufacturing the second stacked stage 201. Hence, for instance, the off-current of the second memory portion 230 is made larger than the off-current of the first memory portion 130. To compensate for this difference in off-current, the layer thickness $t_2$ of the second memory portion 230 is made larger than the layer thickness $t_1$ of the first memory portion 130. Thus, a nonvolatile memory device including stacked memory portions is provided in which stable operation is achieved by reducing the characteristic difference due to the influence of thermal history during the manufacturing process between the first memory portion 130 and the second memory portion 230.

Figure 7A:
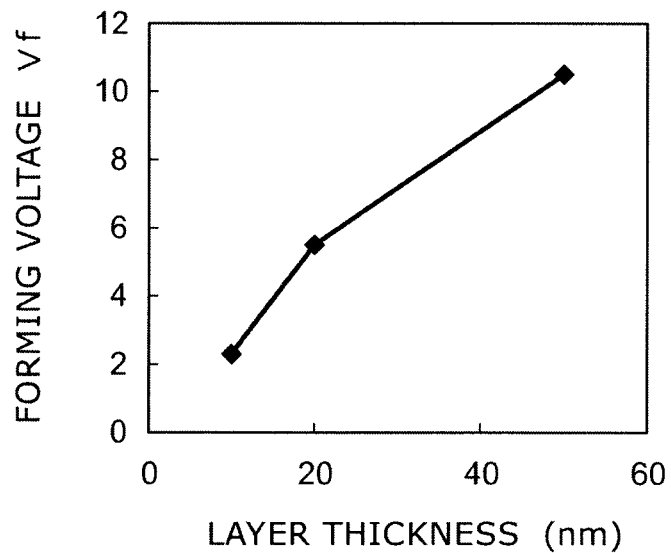
FIGS. 7A and 7B are graphs illustrating the characteristics of the nonvolatile memory device according to the second embodiment.
Figure 7B:
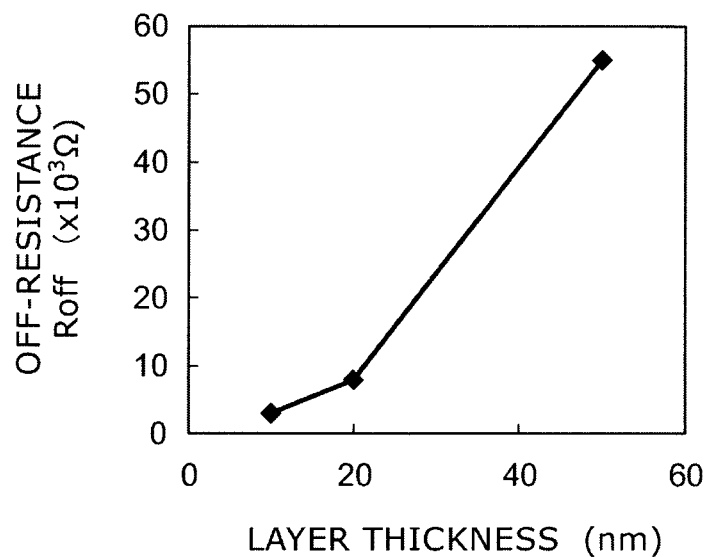

FIGS. 7A and 7B are graphs illustrating the characteristics of the nonvolatile memory device according to the second embodiment. More specifically, FIGS. 7A and 7B illustrate the relationship between the layer thickness and the forming voltage $V_f$ of the memory portion, and the relationship between the layer thickness and the off-resistance $R_{off}$, respectively, in the case where the memory portion is made of $NiO_x$. The horizontal axis represents the layer thickness. The vertical axis of FIG. 7A represents the forming voltage $V_f$, and the vertical axis of FIG. 7B represents the off-resistance $R_{off}$. The off-resistance $R_{off}$ was determined from the current value at an applied voltage of 0.1 V.

As shown in FIG. 7A, with the increase of the layer thickness of the memory portion, the forming voltage $V_f$ increases. Furthermore, as shown in FIG. 7B, with the increase of the layer thickness of the memory portion, the off-resistance $R_{off}$ increases. That is, the off-current $I_{off}$ decreases. As described above, these forming voltage $V_f$ and off-resistance $R_{off}$ (i.e., off-current $I_{off}$) vary with e.g. the thermal history during the process for manufacturing the memory portion. To compensate for this variation, the layer thickness $t_1$ of the first memory portion 130 and the layer thickness $t_2$ of the second memory portion 230 are varied. Thus, a nonvolatile memory device including stacked memory portions and a method for manufacturing the same are provided in which stable operation is achieved by reducing the characteristic difference due to thermal history during the process for manufacturing the first memory portion 130 and the second memory portion 230.

Here, also in the case where the first upper electrode 140 and the second lower electrode 210 are separately provided as illustrated in FIGS. 5A and 5B, the layer thickness $t_2$ of the second memory portion 230 can be made different from the layer thickness $t_1$ of the first memory portion 130. Thus, a nonvolatile memory device including stacked memory portions is provided in which stable operation is achieved by reducing the characteristic difference due to the influence of thermal history during the manufacturing process between the first memory portion 130 and the second memory portion 230.

Furthermore, it is also possible to simultaneously use the configuration in which the second oxygen composition ratio of the second memory portion 230 is made different from the first oxygen composition ratio of the first memory portion 130, and the configuration in which the layer thickness $t_2$ of the second memory portion 230 is made different from the layer thickness $t_1$ of the first memory portion 130. Also in this case, a nonvolatile memory device including stacked memory portions is provided in which stable operation is achieved by reducing the characteristic difference due to the influence of thermal history during the manufacturing process.

Third Embodiment

Figure 8:
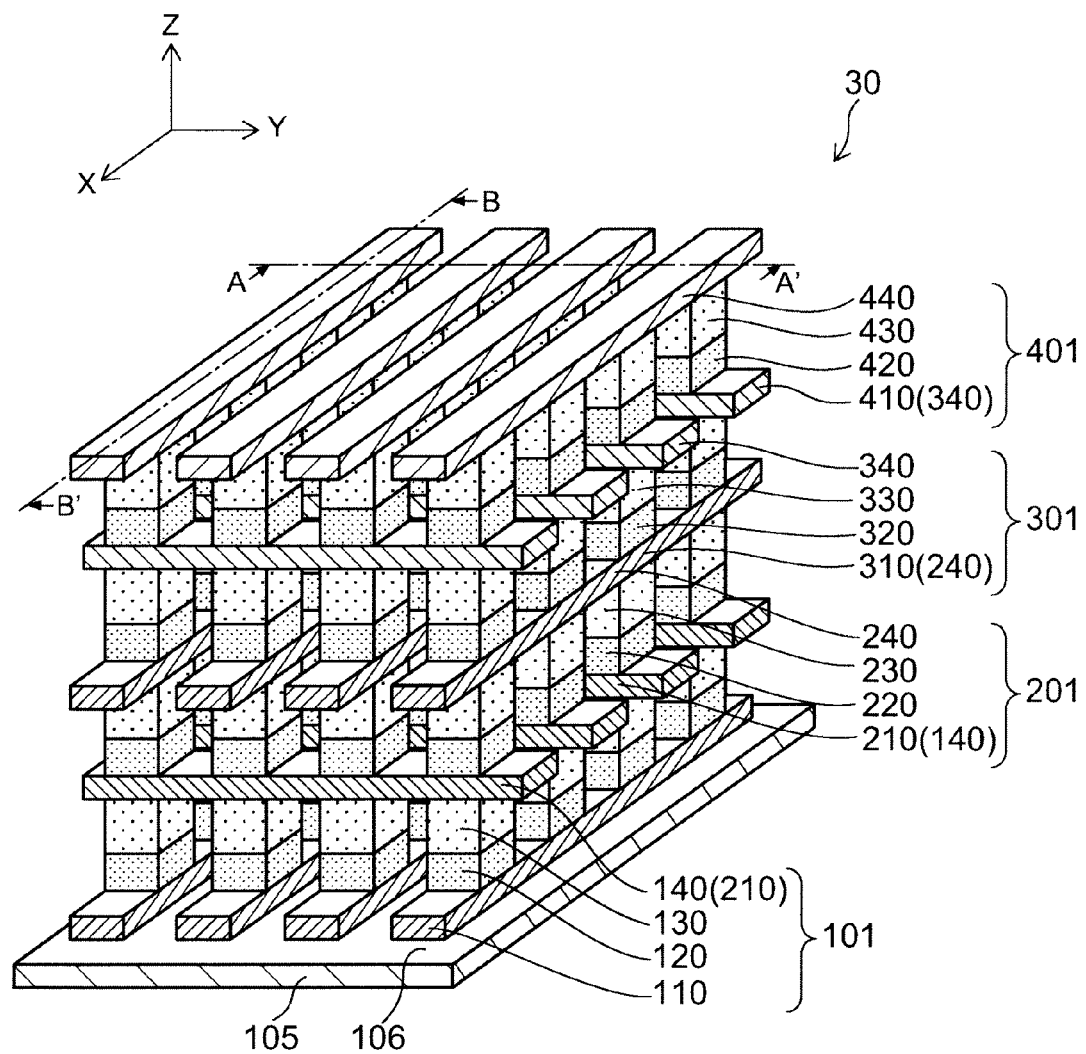
FIG. 8 is a schematic view illustrating the configuration of a nonvolatile memory device according to a third embodiment.

FIG. 8 is a schematic view illustrating the configuration of a nonvolatile memory device according to a third embodiment.

Figures 9A, 9B:
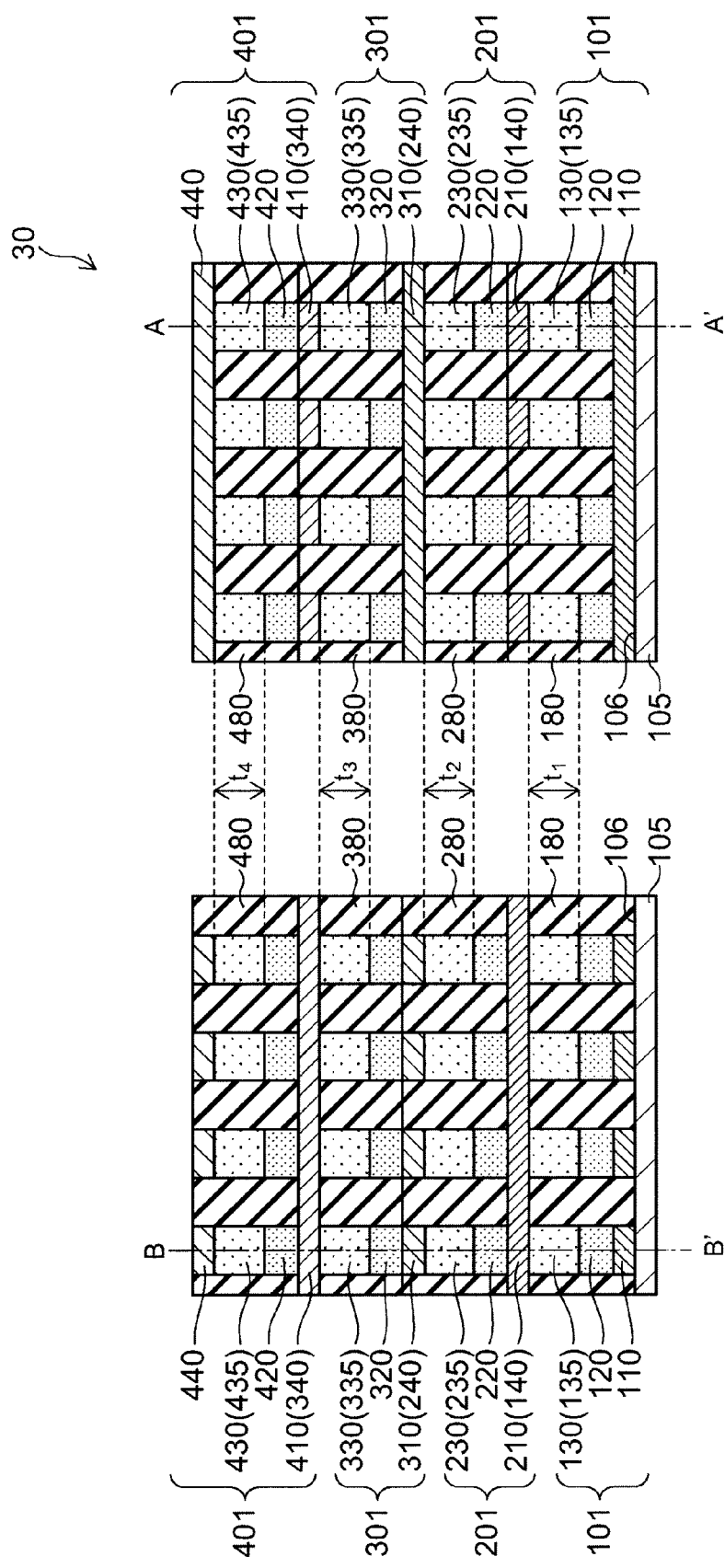
FIGS. 9A and 9B are schematic cross-sectional views illustrating the configuration of the nonvolatile memory device according to the third embodiment.

FIGS. 9A and 9B are schematic cross-sectional views illustrating the configuration of the nonvolatile memory device according to the third embodiment.

FIG. 8 is a schematic perspective view illustrating the configuration of the nonvolatile memory device according to the third embodiment. FIG. 9A is a cross-sectional view taken along line A-A' of FIG. 8, and FIG. 9B is a cross-sectional view taken along line B-B' of FIG. 8.

As shown in FIGS. 8 to 9B, the nonvolatile memory device 30 according to the third embodiment further includes a third stacked stage 301 and a fourth stacked stage 401 in addition to the nonvolatile memory device 10 including the first stacked stage 101 and the second stacked stage 201 illustrated in FIGS. 1A to 2B.

More specifically, the nonvolatile memory device 30 further includes a third lower electrode 310 provided on the second memory portion 230, a third upper electrode 340 opposed to the third lower electrode 310, and a third memory portion 330 provided between the third lower electrode 310 and the third upper electrode 340. Furthermore, the nonvolatile memory device 30 further includes a fourth lower electrode 410 provided on the third memory portion 330, a fourth upper electrode 440 opposed to the fourth lower electrode 410, and a fourth memory portion 430 provided between the fourth lower electrode 410 and the fourth upper electrode 440. In the nonvolatile memory device 30, the first upper electrode 140 and the second lower electrode 210 are identical, the second upper electrode 240 and the third lower electrode 310 are identical, and the third upper electrode 340 and the fourth lower electrode 410 are identical. However, these electrodes may be separately provided.

The third lower electrode 310 and the third upper electrode 340 opposed to each other form a third memory cell portion 335. In the portion between the third memory cell portions 335, a third device isolation insulating region 380 can be provided. Furthermore, the fourth lower electrode 410 and the fourth upper electrode 440 opposed to each other form a fourth memory cell portion 435. In the portion between the fourth memory cell portions 435, a fourth device isolation insulating region 480 can be provided. These third device isolation insulating region 380 and fourth device isolation insulating region 480 can also include e.g. a silicon oxide film, silicon nitride film, or aluminum nitride film.

The third memory portion 330 includes a third metal oxide having a third oxygen composition ratio and has a third layer thickness $t_3$. The fourth memory portion 430 includes a fourth metal oxide having a fourth oxygen composition ratio and has a fourth layer thickness $t_4$.

In the nonvolatile memory device 30 of this embodiment, at least either of the first oxygen composition ratio, second oxygen composition ratio, third oxygen composition ratio, and fourth oxygen composition ratio, and the first layer thickness $t_1$, second layer thickness $t_2$, third layer thickness $t_3$, and fourth layer thickness $t_4$, are different from each other.

In the nonvolatile memory device 30 according to this embodiment illustrated in FIGS. 8 to 9B, for instance, the first layer thickness $t_1$, second layer thickness $t_2$, third layer thickness $t_3$, and fourth layer thickness $t_4$ are equal, but the first oxygen composition ratio, second oxygen composition ratio, third oxygen composition ratio, and fourth oxygen composition ratio are different.

Thus, by reducing the characteristic difference due to the influence of thermal history during the manufacturing process between the first to fourth memory portion 130, 230, 330, 430, a nonvolatile memory device including stacked memory portions is provided, in which stable operation is realized.

For instance, by varying the film formation condition for forming the films serving as the first to fourth memory portion 130, 230, 330, 430, the first to fourth oxygen composition ratio can be varied. For instance, in the case of using $NiO_x$ for the memory portion, film formation is performed by DC sputtering a Ni target in Ar gas added with $O_2$. Here, for instance, by varying the flow rate of Ar gas and the flow rate of $O_2$ gas, the first to fourth oxygen composition ratio can be varied.

In this case, for instance, the film formation condition can be adjusted so that the oxygen composition ratio in $NiO_x$ decreases from the first memory portion 130 to the fourth memory portion 430. This can reduce the difference in the off-current of the high resistance state in the layers of the first to fourth memory portion 130, 230, 330, 430.

Fourth Embodiment

Figure 10:
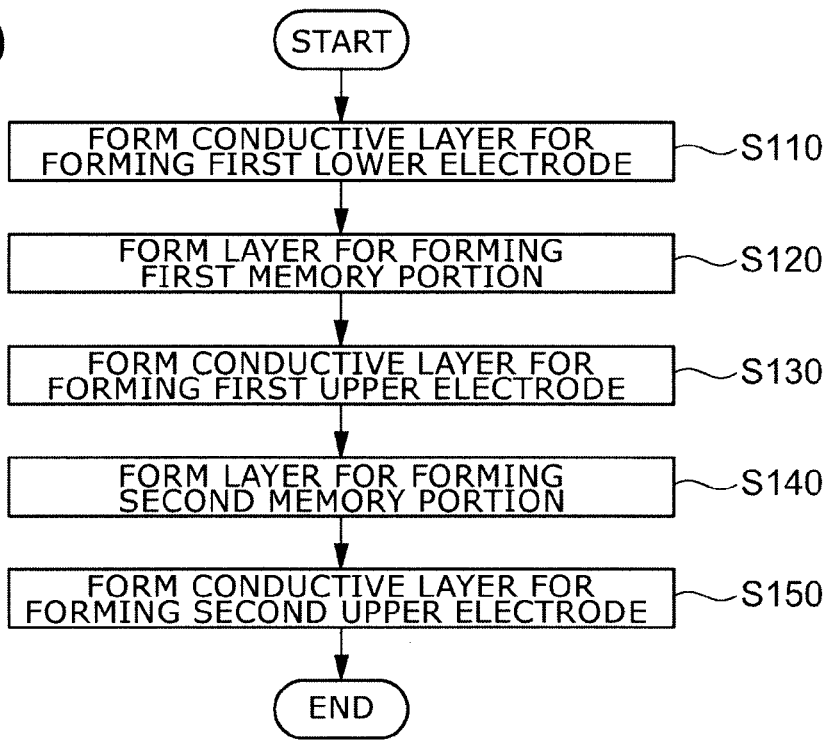
FIG. 10 is a flow chart illustrating a method for manufacturing a nonvolatile memory device according to a fourth embodiment.

FIG. 10 is a flow chart illustrating a method for manufacturing a nonvolatile memory device according to a fourth embodiment. This example illustrates part of the method for manufacturing a nonvolatile memory device in which the electrode 140 is shared between the first memory portion 130 and the second memory portion 230 as described above with reference to FIGS. 1A to 2B.

As illustrated in FIG. 10, in the method for manufacturing a nonvolatile memory device according to the fourth embodiment of, first, a conductive layer for forming a first lower electrode 110 is formed on the major surface 106 of a substrate 105 (step S110).

Next, on the first lower electrode 110, a layer for forming a first memory portion 130 having a first oxygen composition ratio and a first layer thickness $t_1$ is formed (step S120). For instance, as the layer for forming a first memory portion 130, $NiO_x$ is formed as a metal oxide by e.g. DC sputtering.

Next, on the first memory portion 130, a conductive layer for forming a first upper electrode 140 is formed (step S130). At this time, for instance, part of the patterning of the first memory portion 130 and the patterning of the first upper electrode 140 can be simultaneously performed. Furthermore, a first switching element portion 120 can be formed between the first lower electrode 110 and the first memory portion 130, or between the first memory portion 130 and the first upper electrode 140. Furthermore, a buffer layer can also be formed between these layers.

Next, on the first upper electrode 140, a layer for forming a second memory portion 230 having at least one of a second oxygen composition ratio different from the first oxygen composition ratio and a second layer thickness $t_2$ different from the first layer thickness $t_1$ is formed (step S140). For instance, as described above, the first oxygen composition ratio and the second oxygen composition ratio can be varied by varying the flow rate of oxygen gas for forming the film serving as the memory portion. Furthermore, the thickness of the film serving as the memory portion can be varied by varying the flow rate of the raw material gas, the applied electrical power, and the film formation time for forming the film serving as the memory portion. Here, the second oxygen composition ratio can be set lower than the first oxygen composition ratio. Furthermore, the second layer $t_2$ can be set thicker than the aforementioned first layer thickness $t_1$.

Next, on the second memory portion 230, a conductive layer for forming a second upper electrode 240 is formed (step S150). At this time, for instance, part of the patterning of the second memory portion 230 and the patterning of the second upper electrode 240 can be simultaneously performed. Furthermore, a second switching element portion 220 can be formed between the second lower electrode 210 (first upper electrode 140) and the second memory portion 230, or between the second memory portion 230 and the second upper electrode 240. Furthermore, a buffer layer can also be formed between these layers.

Thus, a nonvolatile memory device including stacked memory portions is provided in which stable operation is achieved by reducing the characteristic difference due to the influence of thermal history during the manufacturing process between the first and second memory portion 130, 230.

As described above, the process of forming the second memory portion 230 can include the process of performing vapor phase film formation using a gas having a different composition from the gas used in the process of forming the first memory portion 130.

Here, the process of forming the second memory portion 230 can use the same target as the process of forming the first memory portion 130.

The composition of the atmosphere gas in the treatment after forming the film serving as the first memory portion 130 in the process of forming the first memory portion 130 can be made different from the composition of the atmosphere gas in the treatment after forming the film serving as the second memory portion 230 in the process of forming the second memory portion 230. Thus, the oxygen composition ratio can be varied between in the first memory portion 130 and in the second memory portion 230.

Furthermore, the method for manufacturing a nonvolatile memory device according to this embodiment can further include the process of forming a first switching element portion 120 in at least one of between the first electrode 110 and the first memory portion 130 and between the second electrode 140 and the first memory portion 130, and the process of forming a second switching element portion 220 being different in oxygen composition ratio from the first switching element portion 120 in at least one of between the second electrode 140 and the second memory portion 230 and between the third electrode (e.g., second upper electrode 240) and the second memory portion 230. Accordingly, the amount of oxygen diffusing from the first switching element portion 120 into the first memory portion 130 and the amount of oxygen diffusing from the second switching element portion 220 into the second memory portion 230 can be made different. Thus, the oxygen composition ratio can be made different in the first memory portion 130 and in the second memory portion 230.

The foregoing has described the method for manufacturing the structure of the nonvolatile memory device 10 including the first stacked stage 101 and the second stacked stage 201 illustrated in FIGS. 1A to 2B. However, the nonvolatile memory device 30 including the first to fourth stacked stage 101, 201, 301, 401 illustrated in FIGS. 8 to 9B can also be manufactured by a similar method.

Figure 11:
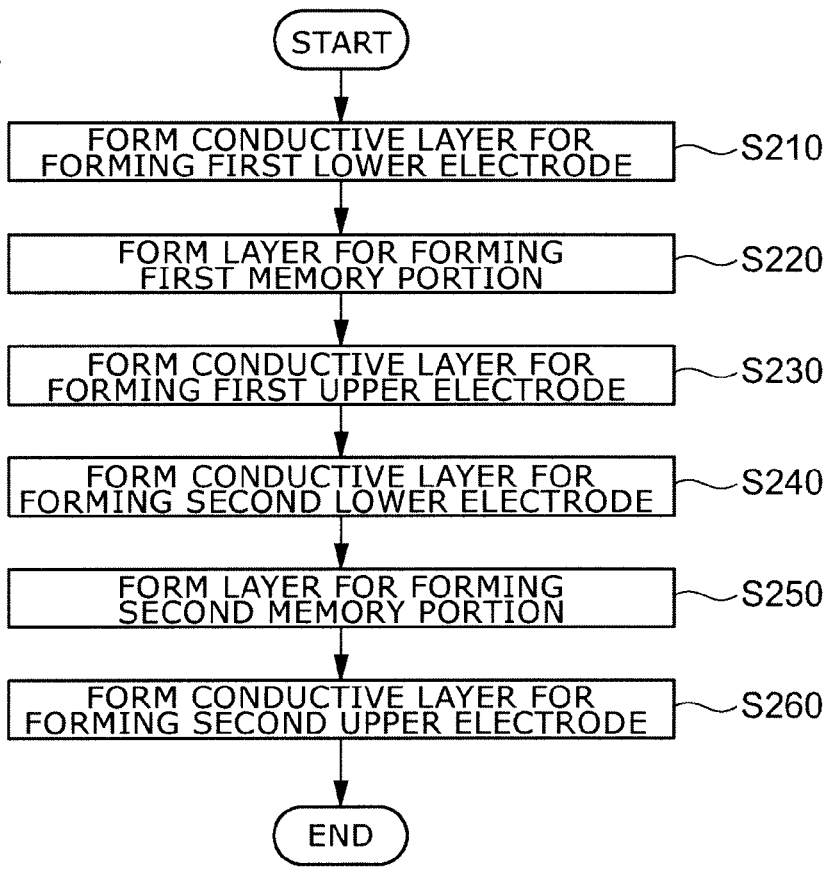
FIG. 11 is a flow chart showing another example of the method for manufacturing a nonvolatile memory device according to the fourth embodiment.

FIG. 11 is a flow chart showing another example of the method for manufacturing a nonvolatile memory device according to the fourth embodiment. More specifically, this example illustrates part of the process for manufacturing the nonvolatile memory device having the structure described above with reference to FIGS. 5A and 5B. In the following, with reference also to FIGS. 5A and 5B, the manufacturing method of this example is described.

First, a conductive layer for forming a first lower electrode 110 is formed on the major surface 106 of a substrate 105 (step S210).

Next, on the first lower electrode 110, a layer for forming a first memory portion 130 having a first oxygen composition ratio and a first layer thickness $t_1$ is formed (step S220). For instance, as the layer for forming a first memory portion 130, $NiO_x$ is formed as a metal oxide by e.g. DC sputtering.

Next, on the first memory portion 130, a conductive layer for forming a first upper electrode 140 is formed (step S230). At this time, for instance, part of the patterning of the first memory portion 130 and the patterning of the first upper electrode 140 can be simultaneously performed. Furthermore, a first switching element portion 120 can be formed between the first lower electrode 110 and the first memory portion 130, or between the first memory portion 130 and the first upper electrode 140. Furthermore, a buffer layer can also be formed between these layers.

Next, on the first upper electrode 140, a conductive layer for forming a second lower electrode 210 is formed (step S240).

Next, on the second lower electrode 210, a layer for forming a second memory portion 230 having at least one of a second oxygen composition ratio different from the first oxygen composition ratio and a second layer thickness $t_2$ different from the first layer thickness $t_1$ is formed (step S250). For instance, as described above, the first oxygen composition ratio and the second oxygen composition ratio can be varied by varying the flow rate of oxygen gas for forming the film serving as the memory portion. Furthermore, the thickness of the film serving as the memory portion can be varied by varying the flow rate of the raw material gas, the applied electrical power, and the film formation time for forming the film serving as the memory portion. Here, the second oxygen composition ratio can be set lower than the first oxygen composition ratio. Furthermore, the second layer thickness $t_2$ can be set thicker than the aforementioned first layer thickness $t_1$.

Next, on the second memory portion 230, a conductive layer for forming a second upper electrode 240 is formed (step S260). At this time, for instance, part of the patterning of the second memory portion 230 and the patterning of the second upper electrode 240 can be simultaneously performed. Furthermore, a second switching element portion 220 can be formed between the second lower electrode 210 and the second memory portion 230, or between the second memory portion 230 and the second upper electrode 240. Furthermore, a buffer layer can also be formed between these layers.

Thus, a nonvolatile memory device including stacked memory portions is provided in which stable operation is achieved by reducing the characteristic difference due to the influence of thermal history during the manufacturing process between the first and second memory portion 130, 230.

The embodiments of the invention have been described above with reference to examples. However, the invention is not limited to these examples. For instance, any specific configurations of the components serving as the nonvolatile memory device and the method for manufacturing the same are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Furthermore, those skilled in the art can suitably modify and implement the nonvolatile memory device and the method for manufacturing the same described above in the embodiments of the invention. All the nonvolatile memory devices and the methods for manufacturing the same thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile memory device comprising:
   a substrate;
   a first electrode extending in a first direction and provided on the substrate;

a second electrode extending in a second direction crossing the first direction and provided on the first electrode;

a third electrode extending in a third direction crossing the second direction and provided on the second electrode;

a first memory portion provided between the first electrode and the second electrode and having a first oxygen composition ratio and a first layer thickness; and a second memory portion provided between the second electrode and the third electrode and having at least one of a second oxygen composition ratio lower than the first oxygen composition ratio and a second layer thickness thicker than the first layer thickness, at least one of the second oxygen composition ratio and the second layer thickness being configured to compensate a difference between an electrical characteristic of the first memory portion and an electrical characteristic of the second memory portion, wherein the second memory portion is stacked on the first memory portion through the second electrode.

2. The device according to claim 1, wherein the second oxygen composition ratio is lower than the first oxygen composition ratio.

3. The device according to claim 1, wherein the second layer thickness is thicker than the first layer thickness.

4. The device according to claim 1, further comprising:

a first switching element portion provided in at least one of between the first electrode and the first memory portion, and between the second electrode and the first memory portion; and a second switching element portion provided in at least one of between the second electrode and the second memory portion, and between the third electrode and the second memory portion.

5. The device according to claim 4, wherein an oxygen composition ratio of the second switching element portion is different from an oxygen composition ratio of the first switching element portion.

6. A nonvolatile memory device comprising:

a substrate;

a first electrode extending in a first direction and provided on the substrate;

a second electrode extending in a second direction crossing the first direction and provided on the first electrode;

a third electrode extending in a third direction and provided on the second electrode;

a fourth electrode extending in a fourth direction crossing the third direction and provided on the third electrode;

a first memory portion provided between the first electrode and the second electrode and having a first oxygen composition ratio and a first layer thickness; and a second memory portion provided between the third electrode and the fourth electrode and having a second oxygen composition ratio lower than the first oxygen composition ratio and a second layer thickness thicker than the first layer thickness, at least one of the second oxygen composition ratio and the second layer thickness being configured to compensate a difference between an electrical characteristic of the first memory portion and an electrical characteristic of the second memory portion, wherein the second memory portion is stacked on the first memory portion through the second electrode and the third electrode.

7. The device according to claim 6, further comprising:

a first switching element portion provided in at least one of between the first electrode and the first memory portion, and between the second electrode and the first memory portion; and a second switching element portion provided in at least one of between the third electrode and the second memory portion, and between the fourth electrode and the second memory portion.

8. The device according to claim 7, wherein an oxygen composition ratio of the second switching element portion is different from an oxygen composition ratio of the first switching element portion.

9. A method for manufacturing a nonvolatile memory device, comprising:

forming a first electrode extending in a first direction on a substrate;

forming a first memory portion having a first oxygen composition ratio and a first layer thickness on the first electrode;

forming a second electrode provided on the first memory portion and extending in a second direction crossing the first direction;

forming a second memory portion having a second oxygen composition ratio lower than the first oxygen composition ratio and a second layer thickness thicker than the first layer thickness on the second electrode, at least one of the second oxygen composition ratio and the second layer thickness being configured to compensate a difference between an electrical characteristic of the first memory portion and an electrical characteristic of the second memory portion; and forming a third electrode provided on the second memory portion and extending in a direction crossing the second direction, wherein a time period over which the first memory portion is subjected to a heat treatment is longer than a time period over which the second memory portion is subjected to a heat treatment.

10. The method according to claim 9, wherein the forming the second memory portion includes performing vapor phase film formation using a gas having a composition different from a composition of a gas used in the forming the first memory portion.

11. The method according to claim 9, wherein the forming the second memory portion includes using a target identical to a target used in the forming the first memory portion.

12. The method according to claim 9, wherein a composition of an atmosphere gas in a treatment after forming a film serving as the first memory portion in the forming the first memory portion is different from a composition of an atmosphere gas in a treatment after forming a film serving as the second memory portion in the forming the second memory portion.

13. The method according to claim 9, further comprising:

forming a first switching element portion in at least one of between the first electrode and the first memory portion, and between the second electrode and the first memory portion; and forming a second switching element portion in at least one of between the second electrode and the second memory portion, and between the third electrode and the second memory portion, the second switching element portion having an oxygen composition ratio different from an oxygen composition ratio in the first switching element portion.

14. A method for manufacturing a nonvolatile memory device, comprising:

forming a first electrode extending in a first direction on a substrate;

forming a first memory portion having a first oxygen composition ratio and a first layer thickness on the first electrode;

forming a second electrode provided on the first memory portion and extending in a second direction crossing the first direction;

forming a third electrode provided on the second electrode and extending in a direction crossing the second electrode;

forming a second memory portion having a second oxygen composition ratio lower than the first oxygen composition ratio and a second layer thickness thicker than the first layer thickness on the third electrode, at least one of the second oxygen composition ratio and the second layer thickness being configured to compensate a difference between an electrical characteristic of the first memory portion and an electrical characteristic of the second memory portion; and forming a fourth electrode provided on the second memory portion and extending in a direction crossing the third electrode, wherein a time period over which the first memory portion is subjected to a heat treatment is longer than a time period over which the second memory portion is subjected to a heat treatment.

15. The method according to claim 14, wherein the forming the second memory portion includes performing vapor phase film formation using a gas having a composition different from a composition of a gas used in the forming the first memory portion.

16. The method according to claim 14, wherein the forming a second memory portion includes using a target identical to a target used in the forming the first memory portion.

17. The method according to claim 14, wherein a composition of an atmosphere gas in a treatment after forming a film serving as the first memory portion in the forming the first memory portion is different from a composition of an atmosphere gas in a treatment after forming a film serving as the second memory portion in the forming the second memory portion.

18. The method according to claim 14, further comprising:

forming a first switching element portion in at least one of between the first electrode and the first memory portion, and between the second electrode and the first memory portion; and forming a second switching element portion in at least one of between the third electrode and the second memory portion, and between the fourth electrode and the second memory portion, the second switching element portion having an oxygen composition ratio different from an oxygen composition of the first switching element portion.

* * * * *